United States Patent
Chen

(10) Patent No.: US 8,879,038 B2
(45) Date of Patent: Nov. 4, 2014

(54) ARRAY SUBSTRATE, LIQUID CRYSTAL DISPLAY DEVICE AND MANUFACTURING METHOD OF ARRAY SUBSTRATE

(75) Inventor: Chenghung Chen, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 218 days.

(21) Appl. No.: 13/378,834

(22) PCT Filed: Dec. 4, 2011

(86) PCT No.: PCT/CN2011/083431
§ 371 (c)(1),
(2), (4) Date: Dec. 16, 2011

(87) PCT Pub. No.: WO2013/075361
PCT Pub. Date: May 30, 2013

(65) Prior Publication Data
US 2013/0141657 A1 Jun. 6, 2013

(51) Int. Cl.
*G02F 1/13* (2006.01)
(52) U.S. Cl.
USPC .............. 349/144; 349/38; 349/39; 349/142; 349/143; 349/147
(58) Field of Classification Search
USPC ............... 349/38–39, 142–144, 147
See application file for complete search history.

(56) References Cited

U.S. PATENT DOCUMENTS

2008/0068550 A1\* 3/2008 Chang et al. ............... 349/143
2008/0180625 A1   7/2008 Liu et al.
2009/0256985 A1   10/2009 Jung et al.
2010/0253869 A1\* 10/2010 Ting et al. .................. 349/48

FOREIGN PATENT DOCUMENTS

| CN | 1704829 A | 12/2005 |
| CN | 101625493 A | 1/2010 |
| CN | 101699340 A | 4/2010 |
| CN | 101750807 A | 6/2010 |

OTHER PUBLICATIONS

Duan Keyu, the International Searching Authority written comments, Sep. 2012, CN.

\* cited by examiner

*Primary Examiner* — Phu Vu
(74) *Attorney, Agent, or Firm* — IPro, Inc.; Na Xu

(57) ABSTRACT

The present invention discloses an array substrate, a liquid crystal display device and a manufacturing method of array substrate; an array substrate comprises a plurality of thin film transistors and a first pixel electrode connected with the drain electrode of the thin film transistor, wherein the array substrate also comprises a second pixel electrode which is arranged on the bottom of the first pixel electrode and forms mutual insulation with the first pixel electrode; The present invention can increase the penetration rate of the pixel, improve the visual color cast characteristic of a panel, and reduce uneven brightness caused by variation of electrode wire width.

12 Claims, 6 Drawing Sheets

ARRAY SUBSTRATE, LIQUID CRYSTAL DISPLAY DEVICE AND MANUFACTURING METHOD OF ARRAY SUBSTRATE

RELATED APPLICATIONS

This application is the U.S. National Phase under 35 U.S.C. §371 of International Application No. PCT/CN11/83431, filed on Dec. 4, 2011, disclosures of which Applications are incorporated by reference herein.

TECHNICAL FIELD

The present invention relates to the technical field of liquid crystal display, and more specially relates to an array substrate, a liquid crystal display device and a manufacturing method of array substrate.

BACKGROUND

The liquid crystal display device comprises an LCD panel including oppositely arranged array substrate and color filter (CF) between which liquid crystal is filled. The array substrate is also provided with a plurality of pixel electrodes 4; the color light filter is provided with a common electrode; the obliquity of liquid crystal molecules can be controlled by adjusting voltage between the pixel electrodes 4 and the common electrode to form different grey scales. A common liquid crystal display has small visual angle, and the wider visual angle is obtained by adopting the liquid crystal display modes of PVA, PVA, etc. Take PSVA (Polymer stability vertical alignment) as an example, FIG. 1 is a design of a pixel in the mode with polymer stably and vertically aligned. In the generally known PSVA principle, the pixel electrode 4 can be broadly divided into four areas, and the electrode slits respectively faces directions A, B, C, and D; when a potential difference is formed between the upper and the lower panel electrodes, the pattern of power lines caused by the pixel design can roughly make the liquid crystal molecules tip in four directions; then liquid crystal molecules on the surface of the distribution layer are irradiated or heated for solidification and form tilt angles in four directions through liquid crystals or light or thermal reaction materials in the distribution layer.

PSVA technique in the document of the present invention refers to generalized PSVA technique. See the following four documents for reference:

| | |
|---|---|
| 1. SID' 04 Digest, p. 1200; | PSA |
| 2. SID' 09Digest, p. 666; | SC-PVA |
| 3. IDW' 09, p. 747; | SC-PVA |
| 4. SID' 10 Digest, p. 595 | FPA |

The pixel electrode 4 of common PSVA forms a penniform shape. Only when electrode slit exists in the pixel electrode in the voltage applying process of the PSVA manufacturing process, the arrangement of the power line can be used to make the liquid crystal molecules broadly tip to the designed directions, and the liquid crystals on the surface of the distribution layer are then heated or irradiated for solidification to form the tilt angle. However, the component in the vertical direction of the electric field above the electrode slit is actually smaller under bright drive, and the liquid crystal molecules cannot effectively tip in such condition so that the electrode slit area is dimmer than the electrode area.

In addition, the brightness or the penetration of a panel strictly depends on the width of the slits of the pixel electrode, so that when variation of local slit width occurs in the manufacturing process, Mura is generated on the image caused by local uneven brightness.

SUMMARY

The aim of the present invention is to provide an array substrate, a liquid crystal display device and a manufacturing method of array substrate solving the problems of brightness, characteristic, and mura of a liquid crystal display device.

The purpose of the present invention is achieved by the following technical schemes:

an array substrate comprises a plurality of thin film transistors and a first pixel electrode connected with the drain electrode of the thin film transistor, wherein the array substrate also comprises a second pixel electrode which is arranged on the bottom of the first pixel electrode and forms mutual insulation with the first pixel electrode;

Preferably, said array substrate comprises a common line; the second pixel electrode is between the first pixel electrode and the common line; and the first pixel electrode, the second pixel electrode, and the common line are in mutual insulation. This is an embodiment of the array substrate including a common line.

Preferably, the second pixel electrode is provided with a notch in the stacked area of the first pixel electrode and the common line so that only insulation materials rather than metal materials are arranged between the first pixel electrode and the common line; therefore, the memory capacitance formed between the first pixel electrode and the common line is greater to ensure that the electric quantity of the memory capacitor is adequate to maintain crystal deflection in the interval of two scanning cycles.

Preferably, the array substrate is provided with a plurality of recessed contact windows; the first pixel electrode extends into the contact windows and is electrically connected with the drain electrode of the thin film transistor. This is a specific embodiment of the connection between the first pixel electrode and the drain electrode of the thin film transistor.

A liquid crystal display device, comprising an array substrate.

A manufacturing method of an array substrate, comprising the following steps:

A: forming a first passivation layer on a glass substrate;

B: forming a second pixel electrode, a second passivation layer, and a first pixel electrode on the first passivation layer of the array substrate in order.

Preferably, a common line is formed on the glass substrate before Step A. This is an embodiment of the array substrate including a common line.

Preferably, when the second pixel electrode is formed in the Step B, a notch is formed in the stacked area of the first pixel electrode and the common line so that only insulation materials rather than metal materials are arranged between the first pixel electrode and the common line; therefore, the memory capacitance formed between the first pixel electrode and the common line is greater to ensure that the electric quantity of the memory capacitor is adequate to maintain crystal deflection in the interval of two scanning cycles.

Preferably, in Step B, a notch is formed in the stacked area of drain electrodes of the first pixel electrode and the thin film transistors when the second passivation layer is formed, and contact windows are formed when the first pixel electrode is formed. This is a specific embodiment of the connection between the first pixel electrode and the drain electrode of the thin film transistor without additional processes, which is in favor of improving the working efficiency and reducing the cost.

The present invention adds a second pixel electrode between the first pixel electrode and the common line; the second pixel electrode is a floating electrode, and is not electrically connected with other parts. Suppose the voltage difference between the first pixel electrode and the common electrode of the color filter is V1, and a potential difference of V2 exists between the second pixel electrode and the common electrode because of capacitance division, so that the arrangement of the power line still makes the liquid crystal molecule broadly tip in the designed directions. When under actual array substrate drive, the difference between V1 and V2 is not much, so adding an appropriate voltage can make both the first pixel electrode and the second pixel electrode reach a luminance saturation point; thus, a penetration rate higher than that obtained in a conventional mode can be obtained because the luminance difference of the two pixel electrodes is small. When a middle grey scale is under drive, different potentials (V1 and V2) above the second pixel electrode and the first pixel electrode are correlated with different extents of liquid crystal tipping, so that the visual angle color deviation is improved. In addition, the liquid crystal tipping in the present invention mainly depends on the voltage difference between the first pixel electrode and the second pixel electrode so that if the effect of the dimension difference of the electrode slits is reduced, the problem of mora is solved. In summary, the present invention can increase the penetration rate of the pixel, improve the visual angle color deviation of a panel, and reduce uneven brightness caused by variation of electrode wire width.

Wherein: 1, data line; 2, scanning line; 3, thin film transistor (TFT); 31, first metal layer; 32 insulating layer; 33, active layer; 34, ohmic contact layer; 35, second metal layer; 36, first passivation layer; 37 second passivation layer; 4, pixel electrode; 41, common line; 42, contact window; 43, first pixel electrode; 44, second pixel electrode; 45, notch.

DETAILED DESCRIPTION

The present invention is further described by figures and the preferred embodiments as follows.

As shown in FIGS. 1 to 7, a liquid crystal display device comprises an array substrate, wherein the array substrate comprises a plurality of thin film transistors, and a scanning line 2, a data line 1 and a pixel structure which are connected with the gate electrode, the source electrode, and the drain electrode of the thin film transistor (TFT) 3.

Figure 1:
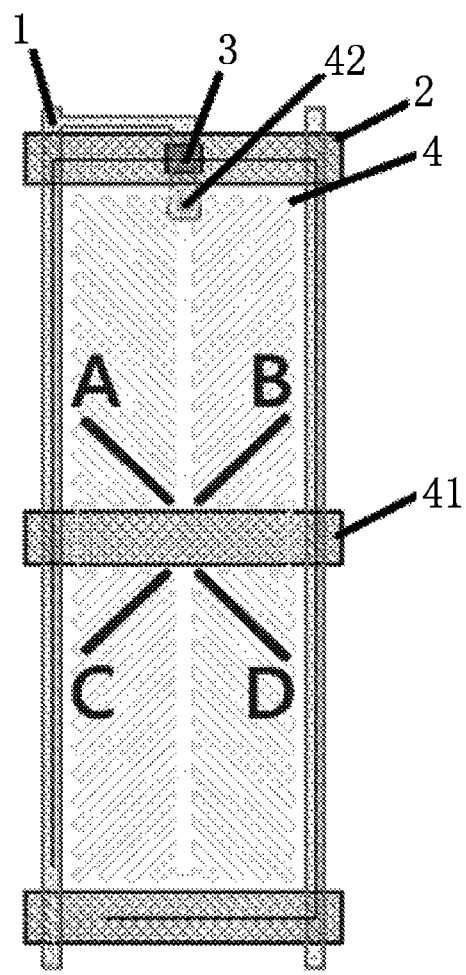
FIG. 1 is a schematic diagram of pixel structure in the PSVA mode.
Figure 2:
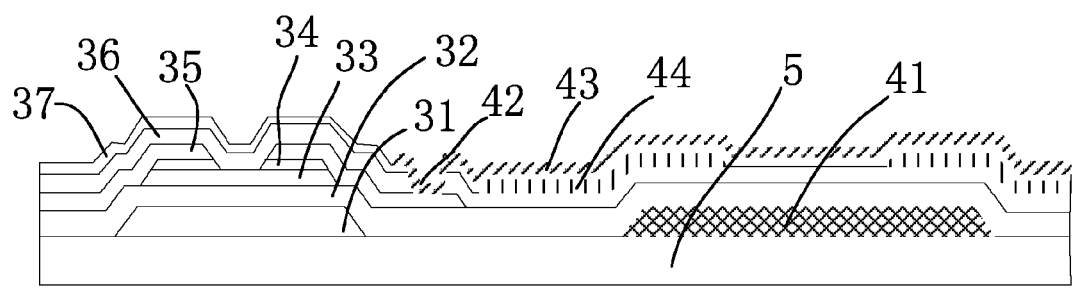
FIG. 2 is a sectional diagram of the pixel structure of the present invention.
Figure 3:
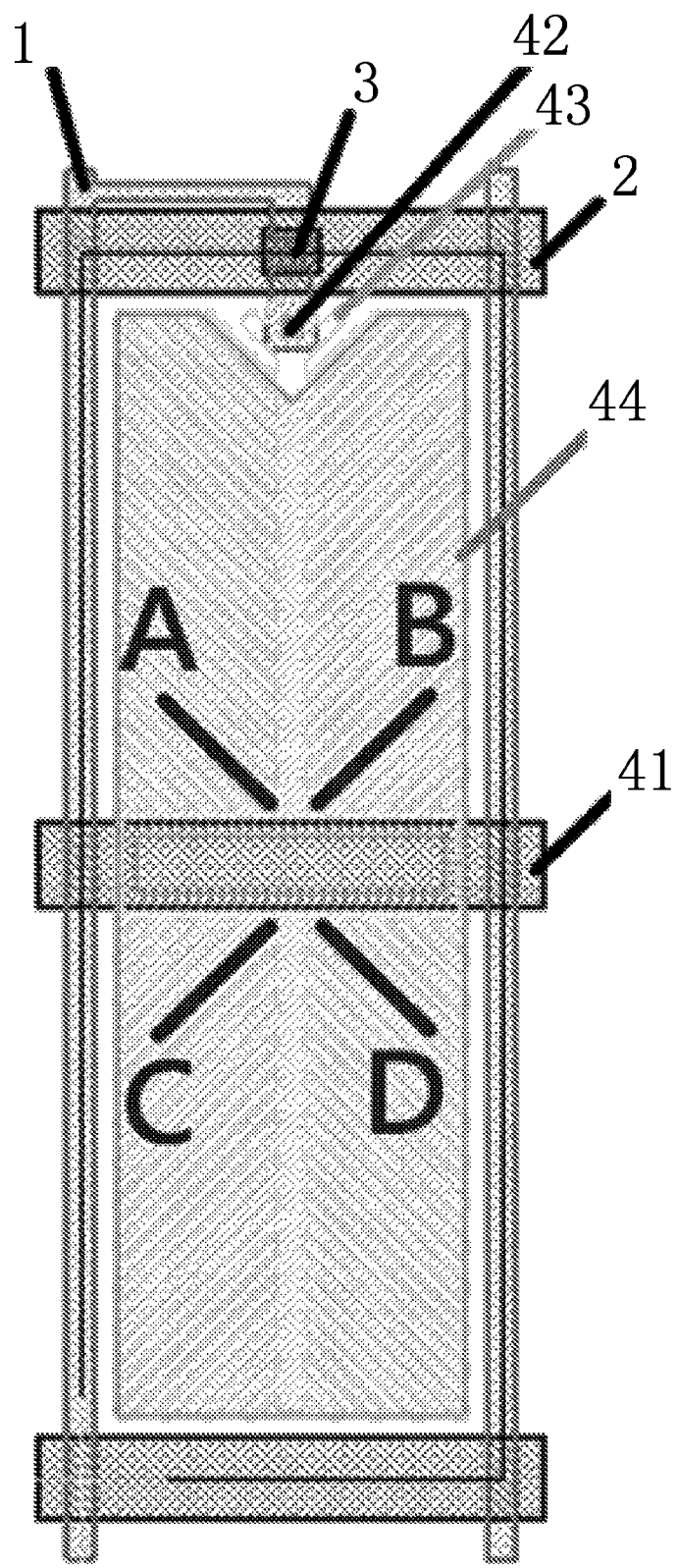
FIG. 3 is a schematic diagram of the pixel structure of the present invention.
Figure 4:
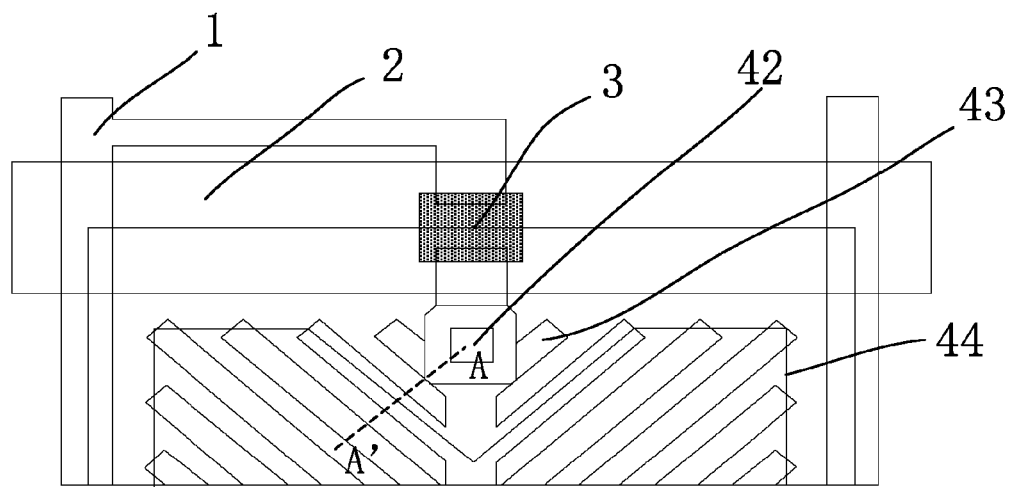
FIG. 4 is an enlarged sectional diagram of the pixel structure of the present invention.
Figure 5:
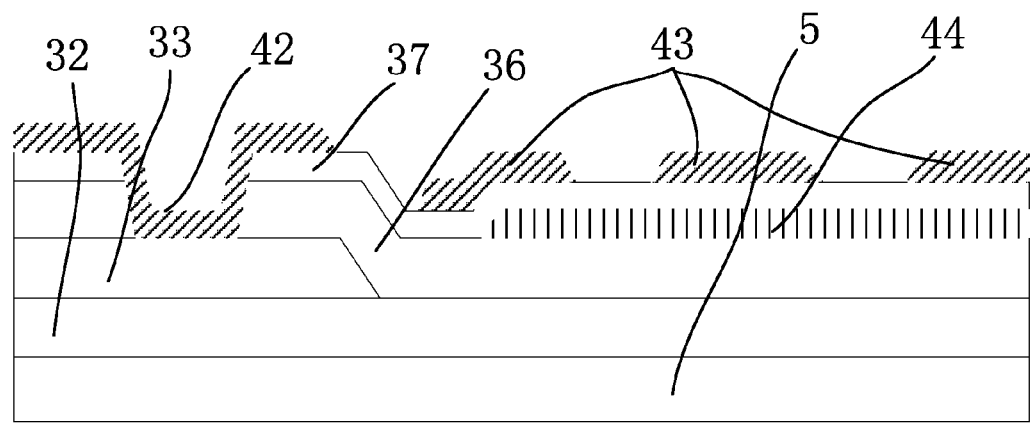
FIG. 5 is a sectional diagram in A-A view.
Figure 6:
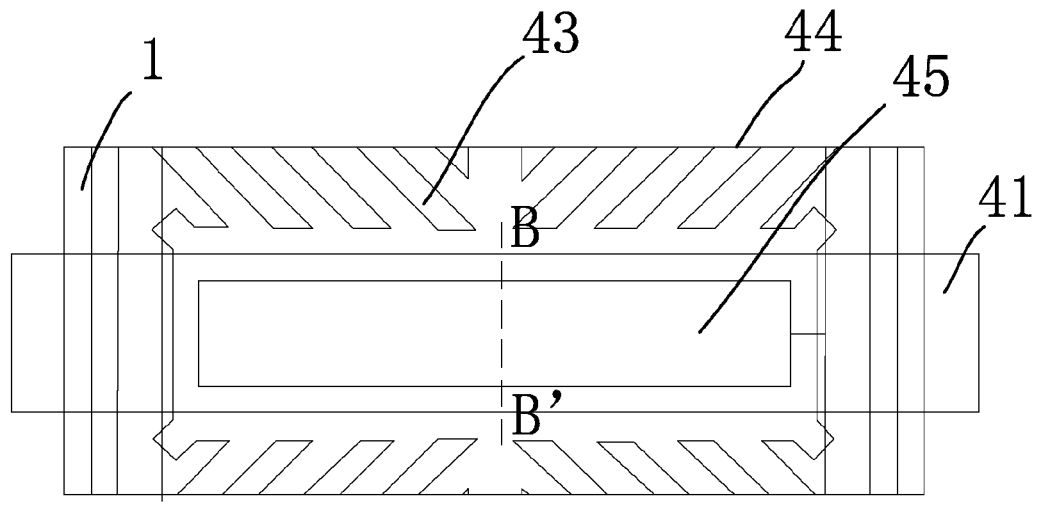
FIG. 6 is an enlarged sectional diagram of the common line area of the pixel structure of the present invention.
Figure 7:
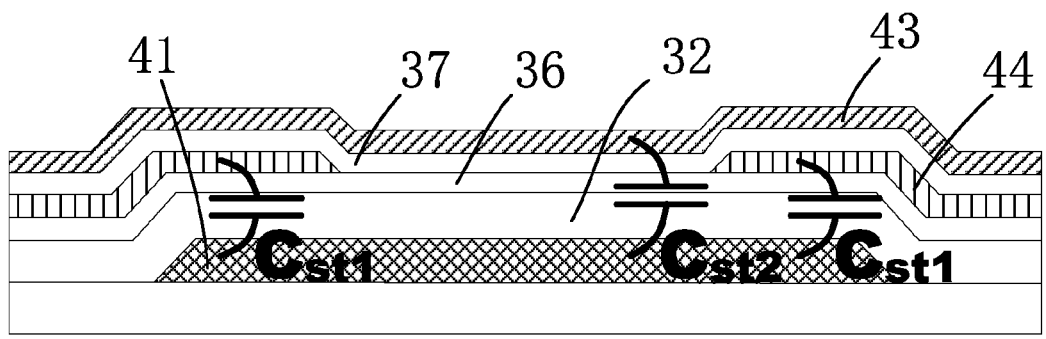
FIG. 7 is a sectional diagram in B-B view.

The thin film transistor (TFT) 3 and the pixel structure are shown in FIG. 2. The thin film transistor (TFT) 3 is on the left side, and the pixel structure is on the right side; both the thin film transistor (TFT) 3 and the pixel structure are on the same glass substrate. The thin film transistor (TFT) 3, the first metal layer 31, the insulating layer 32, the active layer 33, the ohmic contact layer 34, the second metal layer 35, the first passivation layer 36 and the second passivation layer 37 are arranged on the glass substrate in order; one side of the second metal layer 35 near the pixel structure is the drain electrode of the thin film transistor (TFT) 3, and the other side is the source electrode connected with the data line 1. For the pixel structure, the common line 41, the insulating layer 32, the first passivation layer 36, the second pixel electrode 44, the second passivation layer 37 and the first pixel electrode 43 are arranged on the glass substrate. The first pixel electrode 43 penetrates through the first passivation layer 36 and the second passivation layer 37, and is connected with the drain electrode of the thin film transistor (TFT) 3 so as to form the contact window 42. The second pixel electrode 44 is provided with a notch 45 in the stacked area of the first pixel electrode 43 and the common line 41 to increase the storage capacitance (Cst2) between the first pixel electrode 43 and the common line.

The array substrate can be made by the common lightproof cover manufacturing process at present, i. e. the above structures are formed on the glass substrate in order by the procedures of deposition, exposure, development, etching, etc. The specific steps are:

1, The first metal layer 31 and the common line 41 are formed on the glass substrate by the procedures of deposition, exposure, development and etching.

2, An insulating layer 32 is formed on the first metal layer 31 by deposition.

3, The active layer 33 and the ohmic contact layer 34 are formed on the insulating layer 32 in order by deposition, exposure, development and etching.

4, The second metal layer 35 is formed on the insulating layer 32 and the ohmic contact layer 34 by deposition, exposure, development and etching (etching of the ohmic contact layer 34 is required in this step).

5, The first passivation layer 36 is formed on the surface of the whole array substrate by deposition.

6, A first transparent conducting layer (the second pixel electrode 44) is formed on the first passivation layer 36 by deposition, exposure, development and etching, and the notch 45 is arranged in the stacked area of the first pixel electrode 43 and the common line 41.

7, The second passivation layer 37 is formed on the surface of the whole array substrate by deposition.

8, A contact window 42 (VIA) is formed in the position where the second metal layer 35 is connected with the first pixel electrode 43 by deposition, exposure, development and etching.

9, A second transparent conducting layer is formed on the second passivation layer 37 by deposition, exposure, development and etching.

Figure 8:
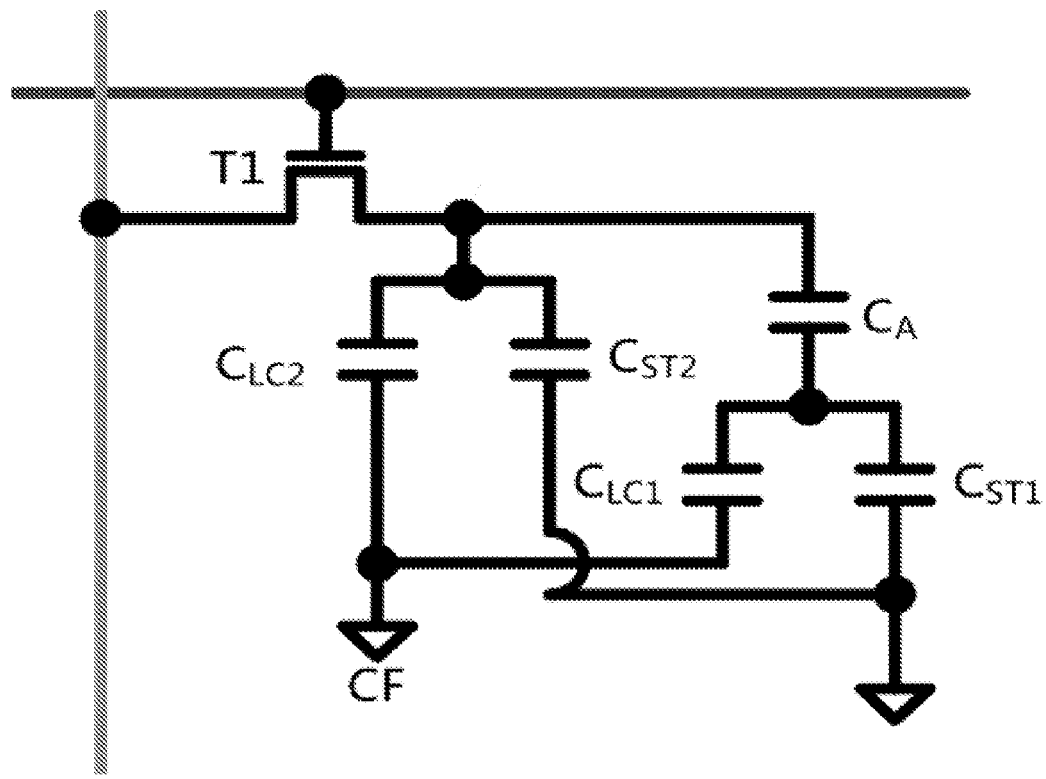
FIG. 8 is a schematic diagram of the present invention.

FIG. 8 is an equivalent circuit diagram of the pixel structure. Compared with the conventional circuit structure, an additional transparent conducting layer is used as the second pixel electrode 44 in the design, so that a capacitance $C_A$ is formed between the second pixel electrode 44 and the first pixel electrode, and a first storage capacitance (Cst1) is formed between the second pixel electrode 44 and the common line 41.

Figure 9:
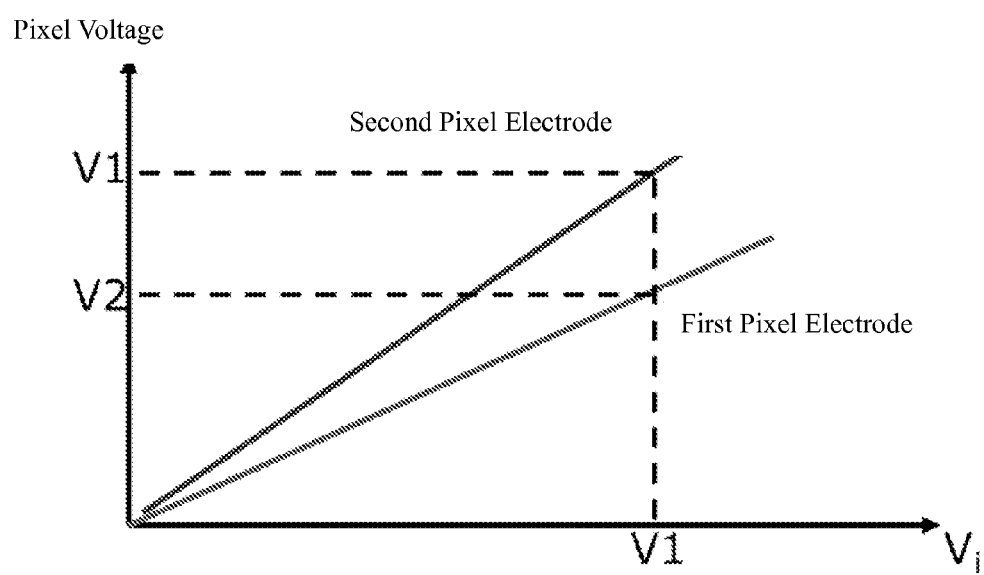
FIG. 9 is a broken line diagram of voltage difference of the present invention.
Figure 10:
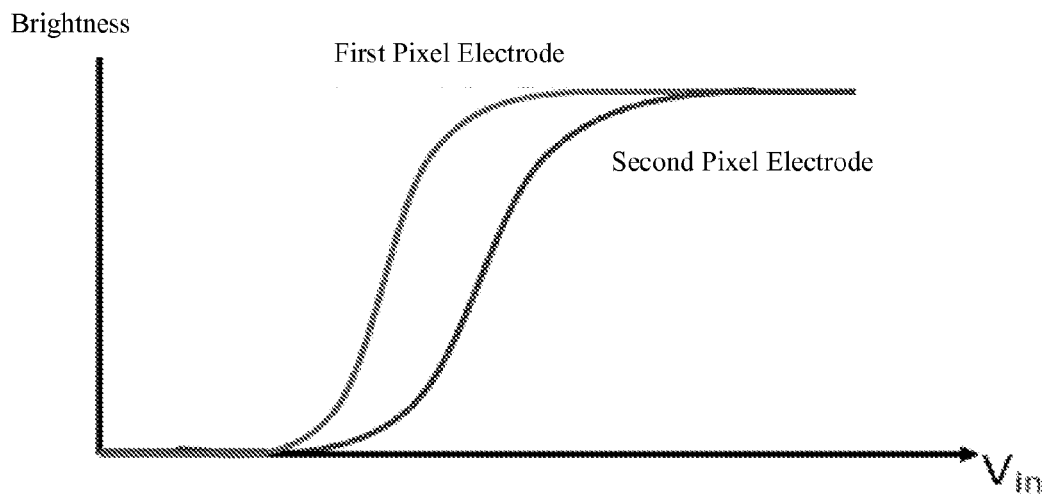
FIG. 10 is a brightness curve diagram of the present invention.

In the process of applying voltage to the PSVA liquid crystal display device, if the potential difference V1 exists between the first pixel electrode 43 and the electrode of the color filter, the capacitance between the first pixel electrode 43 and the electrode of the color filter is $C_{LC2}$; the second pixel electrode 44 is a floating electrode between the common line 41 and the first pixel electrode 43; the capacitance between the second pixel electrode 44 and the common electrode is $C_{LC1}$, and the potential difference of V2 between the second pixel electrode 44 and the common electrode because of capacitance division, so V1≠V2; therefore, the arrangement of the power line still make the liquid crystal molecules broadly tip in the designed direction, and the tilt angle can be formed by heating or irradiating the liquid crystals on the surface of the distribution layer for solidification. When under actual panel drive, if an appropriate voltage is input through the data line 1, a potential difference of Vin is formed between the second pixel electrode and the common electrode; because the potential of the second pixel electrode 44 is divided from the first pixel electrode, the relationship between Vin and the potential difference (Velectrode) between the two pixel electrodes and the common electrode is shown in FIG. 9; the brightness of the two pixel electrode areas corresponding to $V_{in}$ is shown in FIG. 10. Therefore, applying an appropriate voltage can make the first pixel electrode and the second pixel electrode reach the luminance saturation point; thus, a penetration rate higher than that obtained in a conventional mode can be obtained because the luminance difference of the two pixel electrodes is small. In addition, when a middle grey scale is under drive, different potentials above the second pixel electrode and the first pixel electrode make different liquid crystal tip extents so that the visual angle color deviation is improved.

The present invention is described in detail in accordance with the above contents with the specific preferred embodiments. However, the present invention is not limited to the specific embodiments. For the ordinary technical personnel of the technical field of the present invention, on the premise of keeping the concept of the present invention, the technical personnel can also make simple deductions or replacements, and all of which should be considered to belong to the protection scope of the present invention.

I claim:

1. An array substrate, comprising a plurality of thin film transistors, a first pixel electrode connected with a drain electrode of the thin film transistor, and a second pixel electrode which is arranged on the bottom of the first pixel electrode and forms mutual insulation with the first pixel electrode, wherein the second pixel electrode is not electrically connected with other parts, the second electrode defines a notch in a stacked area of the first pixel electrode and a common line, and the second pixel electrode and the common line are arranged on different layers.

2. The array substrate of the claim 1, wherein said array substrate comprises a common line; the second pixel electrode is arranged between the first pixel electrode and the common line; and the first pixel electrode, the second pixel electrode, and the common line are in mutual insulation.

3. The array substrate of the claim 1, wherein said array substrate is provided with a plurality of recessed contact windows; the first pixel electrode extends into the contact windows and is electrically connected with the drain electrode of the thin film transistor.

4. A liquid crystal display device, comprising an array substrate; the array substrate comprises a plurality of thin film transistors, a first pixel electrode connected with the drain electrode of the thin film transistor, and a second pixel electrode which is arranged on the bottom of the first pixel electrode and forms mutual insulation with the first pixel electrode, wherein the second pixel electrode is not electrically connected with other parts, the second electrode defines a notch in a stacked area of the first pixel electrode and a common line, and the second pixel electrode and the common line are arranged on different layers.

5. The liquid crystal display device of the claim 4, wherein said array substrate comprises a common line; the second pixel electrode is arranged between the first pixel electrode and the common line; and the first pixel electrode, the second pixel electrode, and the common line are in mutual insulation.

6. The liquid crystal display device of the claim 4, said array substrate is provided with a plurality of recessed contact windows; the first pixel electrode extends into the contact windows and is electrically connected with the drain electrode of the thin film transistor.

7. A manufacturing method of array substrate, comprising the following steps:

A: forming a first passivation layer on a glass substrate;
B: forming a second pixel electrode, a second passivation layer, and a first pixel electrode on the first passivation layer of the array substrate in order, wherein the second pixel electrode is not electrically connected with other parts, the second electrode defines a notch in a stacked area of the first pixel electrode and a common line, and the second pixel electrode and the common are arranged on different layers.

8. The manufacturing method of the array substrate of the claim 7, wherein a common line is formed on the glass substrate before Step A.

9. The manufacturing method of the array substrate of the claim 8, wherein a notch is formed in the stacked area of drain electrodes of the first pixel electrode and the thin film transistors when the second passivation layer is formed, and contact windows are formed when the first pixel electrode is formed.

10. The array substrate of the claim 1, wherein one second pixel electrode overlaps with the first pixel electrode.

11. The liquid crystal display device of the claim 4, wherein one second pixel electrode overlaps with the first pixel electrode.

12. The manufacturing method of the array substrate of the claim 7, wherein one second pixel electrode overlaps with the first pixel electrode.

* * * * *